United States Patent
Kemp et al.

(10) Patent No.: US 11,853,195 B2
(45) Date of Patent: Dec. 26, 2023

(54) METHODS AND SYSTEMS TO DISCOVER SPECIAL OUTCOMES IN AN INSTRUCTION SET ARCHITECTURE VIA FORMAL METHODS

(71) Applicant: International Business Machines Corporation, Armonk, NY (US)

(72) Inventors: Gregory A. Kemp, Austin, TX (US); Bryant Cockcroft, Austin, TX (US); Debapriya Chatterjee, Austin, NY (US); Bradley Donald Bingham, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 149 days.

(21) Appl. No.: 17/473,326

(22) Filed: Sep. 13, 2021

(65) Prior Publication Data
US 2023/0084275 A1    Mar. 16, 2023

(51) Int. Cl.
*G06F 9/44* (2018.01)
*G06F 11/36* (2006.01)
(Continued)

(52) U.S. Cl.
CPC ...... *G06F 11/3684* (2013.01); *G06F 11/3688* (2013.01); *G06F 11/3692* (2013.01);
(Continued)

(58) Field of Classification Search
CPC ............ G06F 11/3684; G06F 11/3688; G06F 11/3692; G06F 11/0754; G06F 11/263;
(Continued)

(56) References Cited

U.S. PATENT DOCUMENTS 9,697,306 B1   7/2017   Haridass et al.
10,331,415 B2  6/2019   Hatsutori et al.
(Continued)

OTHER PUBLICATIONS

V.V. Belkin et al., ISA Based Functional Test Generation with Application to Self-Test of RISC Processors, Apr. 18-21, 2006, [Retrieved on Jul. 13, 2023]. Retrieved from the internet: <URL: https://ieeexplore.ieee.org/stamp/stamp.jsp?tp=&arnumber=1649575 > 8 Pages (1-2) (Year: 2006).*
(Continued)

*Primary Examiner* — Anibal Rivera
(74) *Attorney, Agent, or Firm* — Scully, Scott, Murphy & Presser, P.C.

(57) ABSTRACT

A method, computer program product, and/or system is disclosed for identifying special cases for testing an integrated circuit that includes defining interesting cases, preferably by a user; obtaining an instruction from an instruction set architecture (ISA); determining that there is an interesting case for the obtained instruction; computing (i) a size of the input space ($I_0$) of the ISA, and (ii) an interesting case space ($I_i$) which is an input space leading to the interesting case for the obtained instruction; obtaining a special case fraction by dividing the interesting case space ($I_i$) by the input space ($I_0$); determining a special case fraction ($I_i$)/($I_0$) is less than a threshold; and identifying, in response to the special case fraction being less than the threshold, the interesting case as a special case. In an approach the special case is documented.

20 Claims, 3 Drawing Sheets

(51) Int. Cl.
*G06F 30/398* (2020.01)
*G06F 11/263* (2006.01)
*G06F 17/10* (2006.01)
*G06F 17/11* (2006.01)
*G06F 30/327* (2020.01)
*G06F 11/07* (2006.01)

(52) U.S. Cl.
CPC ........ *G06F 11/0754* (2013.01); *G06F 11/263* (2013.01); *G06F 17/10* (2013.01); *G06F 17/11* (2013.01); *G06F 30/327* (2020.01); *G06F 30/398* (2020.01)

(58) Field of Classification Search
CPC ........ G06F 17/10; G06F 17/11; G06F 30/398; G06F 30/327
See application file for complete search history.

(56) References Cited

U.S. PATENT DOCUMENTS

| | | | |
|---|---|---|---|
| 10,599,797 | B1 | 3/2020 | Hanna et al. |
| 10,643,012 | B1 | 5/2020 | McIlwain et al. |
| 10,657,307 | B1 | 5/2020 | Jain et al. |
| 10,839,124 | B1 | 11/2020 | Leder et al. |
| 10,929,584 | B1 | 2/2021 | Denkberg et al. |
| 10,936,775 | B2 | 3/2021 | Darbari et al. |
| 11,232,174 | B1* | 1/2022 | Korchemny ............ G06F 30/33 |
| 2003/0220780 | A1 | 11/2003 | Fallah et al. |
| 2005/0102594 | A1* | 5/2005 | Dey ............... G01R 31/318328 714/733 |
| 2016/0371167 | A1 | 12/2016 | Manolios |
| 2017/0169149 | A1 | 6/2017 | Kailas |
| 2018/0032760 | A1* | 2/2018 | Hu .......................... G06F 21/71 |
| 2020/0019653 | A1* | 1/2020 | Gajavelly ............ G06F 30/327 |
| 2020/0302104 | A1 | 9/2020 | Elliott |
| 2021/0150373 | A1* | 5/2021 | Crouse .................. G06N 5/013 |

OTHER PUBLICATIONS

Sandeep Dasgupta et al., A Complete Formal Semantics of x86-64 User-level Instruction Set Architecture, Jun. 22-26, 2019, [ Retrieved on Jul. 13, 2023]. Retrieved from the internet: <URL: https://dl.acm.org/doi/pdf/10.1145/3314221.3314601> 16 Pages ( 1133-1148) (Year: 2019).*

Charvat et al., "Automatic Formal Correspondence Checking of ISA And RTL Microprocessor Description", MTV IEEE 13th International Workshop on, Dec. 10-13, 2012, pp. 1-6.

Nienhuis et al., "Rigorous Engineering For Hardware Security: Formal Modeling and Proof in the CHERI Design . . . Process", SP IEEE Symposium on, May 18-21, 2020, pp. 1-8.

Dasgupta, et al., "A Complete Formal Semantics of x86-64 User-Level Instruction Set Architecture", PLDI'19 40th ACM SIGPLAN Conference on, Jun. 22-26, 2019, pp. 1103-1118.

Reid et al., "End-To-End Verification of ARM Processors With ISA-Formal", CAV'16 Lecture Notes in Computer Science, Jul. 2016, pp. 1-17, vol. 9780.

Xing et al.; "A Formal Instruction-Level GPU Model For Scalable Verification", ICCAD'18 ACM/IEEE international Conference on, Nov. 5-8, 2018, pp. 1-8.

Valiant, L.G., "The Complexity of Computing the Permanent", Theoretical Computer Science, 1978, pp. 189-201, 8, North-Holland Publishing Company.

* cited by examiner

METHODS AND SYSTEMS TO DISCOVER SPECIAL OUTCOMES IN AN INSTRUCTION SET ARCHITECTURE VIA FORMAL METHODS

BACKGROUND

The disclosure herein relates generally to the field of integrated circuit design and testing, and more particularly, to methods, apparatuses, and/or systems to test and verify integrated circuit designs.

As the complexity of microprocessors and other large scale integrated circuits has increased over the years, the resources devoted to design verification have accounted for an increasingly large percentage of the total resources to develop and manufacture such integrated circuits. Verifying the proper functionality of advanced microprocessors having multiprocessing capability is now estimated to consume more time, labor, and resources than actual designing such devices.

In order to find hardware and/or software problems it is known to run "test cases" on a software model version of a processor (also called pre-silicon verification). Microprocessor Pre-Silicon functional verification (FV) is typically accomplished by supplying test templates into an automated test case generation tool which produces assembly level instruction sequences that are used as stimuli. Faulty behavior of the design is detected by driving the stimuli into a design simulator and comparing the actual behavior of the design with the expected behavior implied by the input stimuli. These templates are typically produced by engineers to exercise certain Architectural and Micro Architectural functions within the microprocessor. Historically, functional verification (FV) consisted primarily of generating a large number of test programs and cases and running those test programs on a simulator that modeled the device operation. Design and verification engineers frequently generated such test cases manually with the help of various random and specific test generators.

Random test generators are a type of computer software that is used in functional verification of microprocessors by providing random input stimulus to a microprocessor under test. An operation is a set of specific instructions, the arguments to those instructions, and any additional state information that affects how the instruction is exercised. Computer instructions typically take several arguments and these arguments are typically sized based upon the natural word size of the microprocessor. That is, these arguments are typically 2 to the power of the natural word size of a microprocessor (e.g., the size of the input registers). For example, where the natural word size of a microprocessor is 8 bits, 16 bits, 32 bits, 64 bits, etc., each argument occurs on the order of one per $2^8$, $2^{16}$, $2^{32}$, $2^6$, $2^{etc}$ instructions. The arguments and state information for an operation composes an "input space" for the operation. A random test generator typically will be configured to generate random instructions as input stimulus to the microprocessor based upon the same order as two to the natural word size of the microprocessor.

Most of the input space produces operations that are very similar. For example, if two normal floating-point numbers are divided, resulting in a normal number as the quotient, the exact values for dividend, divisor, and quotient aren't that important or interesting. In some cases, however, one of the possible values of the argument can cause interesting, e.g., divergent, behavior. An example of an instruction that can result in interesting or divergent behavior is divide by zero. Interesting or divergent behavior is also shown by most floating-point operations, where a small change in the input value moves the result from the smallest normalized result to the largest denormalized result, or from the smallest denormalized result to an underflow condition. If a random generator is unlikely to test such interesting or divergent cases, it is preferred that these interesting cases be exercised more often than purely random methods, e.g., a purely random test generator, would permit. The problem is how are all such values, for all such instructions, efficiently and methodically identified. It would be advantageous to methodically, efficiently, and formally identify all such values, for all such instructions

SUMMARY

The summary of the disclosure is given to aid understanding of microprocessor and/or integrated circuit testing methods and/or systems, and programs and random test generators for microprocessor and/or integrated circuit testing, and not with an intent to limit the disclosure or the invention. The present disclosure is directed to a person of ordinary skill in the art. It should be understood that various aspects and features of the disclosure may advantageously be used separately in some instances, or in combination with other aspects and features of the disclosure in other instances. Accordingly, variations and modifications may be made to the techniques, methods, and/or systems for testing and verifying integrated circuits to achieve different effects.

A method, computer program product, and/or system according to one or more embodiments for identifying special cases for testing an integrated circuit is disclosed, where in one or more approaches the system, computer program product and/or method including: defining interesting cases, preferably in an embodiment by a user, wherein interesting cases are results of instructions that deviate from typical outcomes; obtaining an instruction from an instruction set architecture (ISA); determining that there is a first interesting case for the obtained instruction; in response to determining that there is a first interesting case for the obtained instruction, (i) computing a size of the input space ($I_0$) of the instruction set architecture, and (ii) computing a first interesting case space ($I_{1,i}$) which is an input space leading to the first interesting case for the obtained instruction; obtaining a first special case fraction by dividing the first interesting case space ($I_{1,i}$) by the input space ($I_0$); determining the first special case fraction ($I_{1,i}/I_0$) is less than a threshold; and identifying, in response to the first special case fraction being less than the threshold, the interesting case as a first special case. The system, computer program product, and/or method, in an embodiment further including documenting the first special case in response to identifying the interesting case as a first special case. In an aspect, the integrated circuit is a processor, and the instruction set architecture (ISA) for the processor is formally described. According to a further approach, interesting cases and defined by a user, and/or interesting cases imply cases where an output of the instruction diverges significantly from nearby cases. In one or more example embodiments, interesting cases are defined to include at least one of a group consisting of: division by zero; division which results in the smallest possible normal number; division which results in the largest possible subnormal number; division which results in the smallest possible subnormal number; division which results in the largest possible underflow case; and combinations thereof.

In one or more aspects, the interesting case space ($I_i$) (e.g., first interesting case space ($I_{1,i}$) for an instruction) is computed using a Boolean Satisfiability Solver (SAT Solver), where in an embodiment the SAT Solver is a sharp-SAT Solver. The threshold in an approach is at least one of a group consisting of: a fixed threshold, a predetermined threshold, a preset threshold, an adjustable threshold, a programmable threshold, and combinations thereof. In a particular embodiment, the threshold is set by a user and is less than $1:2^{32}$ for a thirty-two (32) bit processor. For other natural word bit size processors, a different threshold is contemplated, for example ratios of one to (two to the power of the natural word bit size of the processor), such as, for example the threshold for a sixty-four (64) bit word processor would have a threshold less than 1:24. A further embodiment includes determining the first special case fraction $(I_{1i})/(I_0)$ is equal to or greater than the threshold, and determining, in response to determining that the first special case fraction is equal to or greater than the threshold, if a second interesting case exists for the obtained instruction.

The system, computer program product, and/or method in one or more embodiments further includes, after identifying an interesting case as special, determining if a second interesting case exists for the obtained instruction, and in one or more aspects, computing, in response to determining a second interesting case exists for the obtained instruction, a second interesting case space $(I_{2i})$ which is an input space leading to the second interesting case for the obtained instruction; obtaining a second special case fraction by dividing the second interesting case space $(I_{2i})$ by the input space $(I_0)$; determining a second special case fraction $(I_{2i})/(I_0)$ is less than the threshold; and identifying, in response to the second special case fraction being less than the threshold, the second interesting case as a second special case. In one or more embodiments, the system, computer program product and/or method further includes performing the steps described above for each instruction in the instruction set architecture (ISA), and/or adjusting, in response to identifying a first special case, a random test generator to increases a probability of generating the first special case.

The foregoing and other objects, features and advantages of the invention will be apparent from the following more particular descriptions of exemplary embodiments of the invention as illustrated in the accompanying drawings.

BRIEF DESCRIPTION OF THE DRAWINGS

The various aspects, features, and embodiments of methods, techniques, products, instruction programming, and/or systems for identifying interesting cases, and more particularly rare or special input combinations that yield interesting outcomes, in an instruction set architecture (ISA) via formal methods will be better understood when read in conjunction with the figures provided. It may be noted that in the figures provided a numbered element is typically numbered according to the figure in which the element is introduced, and is typically referred to by that number throughout succeeding figures and that like reference numbers generally represent like parts of exemplary embodiments of the invention. Embodiments are provided in the figures for the purpose of illustrating aspects, features, and/or various embodiments of the methods, techniques, products, instruction programming, and/or systems for identifying interesting cases, including rare or special input combinations that yield or result in interesting outcomes, in an instruction set architecture (ISA) via formal methods, but the claims should not be limited to the precise arrangement, structures, features, aspects, assemblies, subassemblies, systems, circuitry, functional units, programming, instructions, embodiments, methods, processes, or devices shown. The arrangements, structures, features, aspects, assemblies, subassemblies, functional units, programming, instructions, methods, processes, circuitry, embodiments, and devices shown may be used singularly or in combination with other arrangements, structures, assemblies, subassemblies, systems, features, functional units, programming, instructions, aspects, circuitry, embodiments, methods, processes, and devices.

DETAILED DESCRIPTION

Figure 1A:
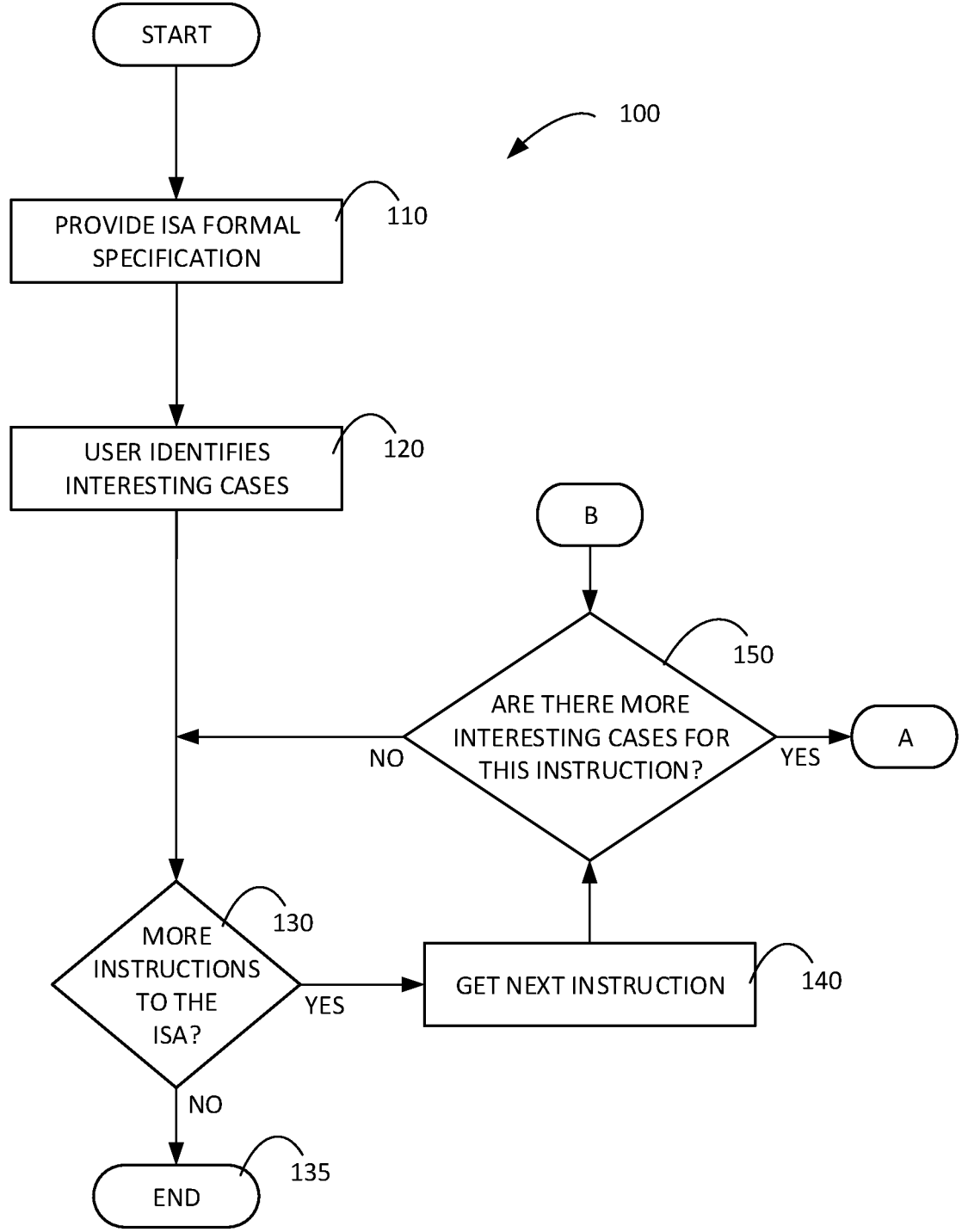
FIGS. 1A & 1B is a flow chart describing an example method of discovering interesting cases, and in an approach rare or special input combinations that yield interesting outcomes, in an instruction set architecture (ISA) via formal methods.

The following description is made for illustrating the general principles of the invention and is not meant to limit the inventive concepts claimed herein. In the following detailed description, numerous details are set forth in order to provide an understanding of methods, techniques, and systems for discovering special input combinations that yield interesting outcomes or results in an integrated circuit and/or microprocessor, e.g., interesting cases, however, it will be understood by those skilled in the art that different and numerous embodiments of the systems, methods, and/or techniques may be practiced without those specific details, and the claims and disclosure should not be limited to the embodiments, features, aspects, assemblies, subassemblies, structures, functional units, programming, instructions, processes, methods, or details specifically described and shown herein. In addition, features described herein can be used in combination with other described features in each of the various possible combinations and permutations.

Unless otherwise specifically defined herein, all terms are to be given their broadest possible interpretation including meanings implied from the specification as well as meanings be noted that, as used in the specification and the appended claims, the singular forms "a," "an" and "the" include plural referents unless otherwise specified, and that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following discussion omits or only briefly describes design verification or testing techniques and systems for integrated circuits fabricated on silicon (chips), including processors and microprocessor systems and architectures, which are apparent to those skilled in the art. It is assumed that those skilled in the art are familiar with integrated circuit verification or testing techniques and/or systems, and in particular pre-silicon testing and design verification of processors.

Random test generators are used in the functional verification of integrated circuits, for example integrated circuits in microprocessors, also referred to as processors, where they provide input stimulus to a microprocessor being tested. There are input combinations when testing a microprocessor design that yield or result in interesting outcomes. For example, the operation divide by zero results in an interesting case (e.g., interesting outcome), as the result of such an operation produces an interrupt or a defined special output value (infinity). Other interesting cases for floating point division includes: division which results in the smallest possible normal number; division which results in the largest possible subnormal number; division that results in the smallest possible subnormal number. Division which results in the largest possible underflow case (a number too small to be represented, even sub-normally).

In testing processors, it can be important that these interesting cases be exercised more often than purely random methods or random test generators would normally allow. Disclosed is a system, programming product, and/or method to discover special input combinations that yield interesting outcomes/cases. In one or more embodiments, a user defines outcomes as "interesting" in a formal description of the instruction set architecture (ISA), and a formal tool, known as a satisfiability solver (e.g., a sharp-SAT solver) identifies all possible input combinations that can satisfy the formal definition of interesting outcome. It may be advantageous to identify the interesting cases that involve a very small subset of the input space such that random test generation is unlikely to hit the interesting cases. The number of possible outcomes can be used to decide or identify if the interesting case is special, and thus potentially requires special attention. In an approach, the number of possible outcomes is compared to a threshold to determine whether the case is a special case that may require special attention.

Figure 1B:
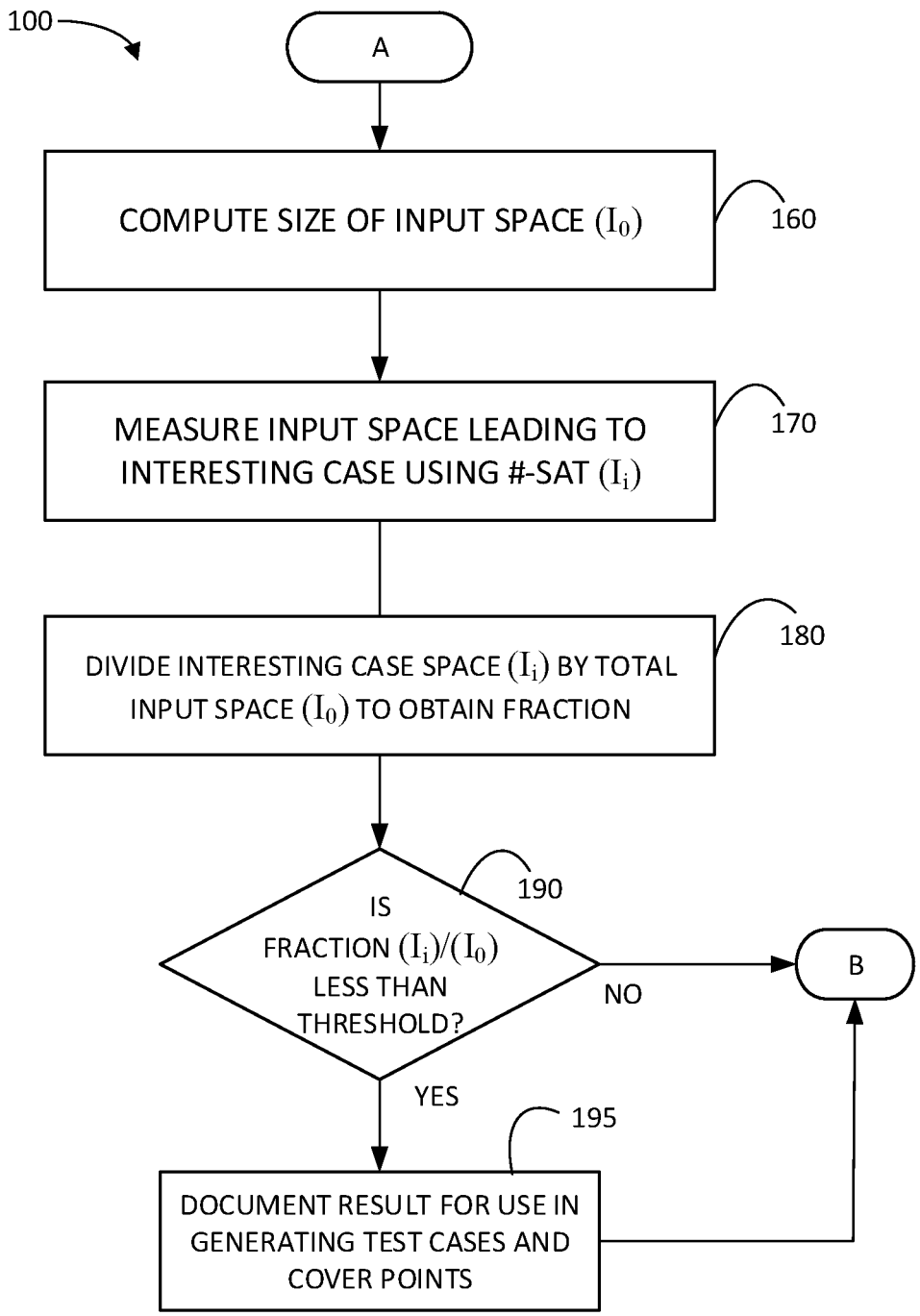

FIGS. 1A-1B outlines an exemplary flowchart in accordance with various embodiments illustrating and describing a method 100 of discovering interesting outcomes in an instruction set architecture (ISA) that are special, and in an embodiment uses formal methods to discover, determine, and/or identify the interesting cases in an instruction set architecture (ISA) that are special. While the method 100 is described for the sake of convenience and not with an intent of limiting the disclosure as comprising a series and/or a number of steps, it is to be understood that the process 100 does not need to be performed as a series of steps and/or the steps do not need to be performed in the order shown and described with respect to FIGS. 1A-1B but the process 100 can be integrated and/or one or more steps can be performed together, simultaneously, or the steps can be performed in the order disclosed or in an alternate order.

In process 100 at 110 the instruction set for the computer is described formally. The instruction set architecture (ISA) defines the way in which a processor is programed at the machine level. Different architectures have their own sets of instructions, syntax, data types, and addressing modes. There are a number of formal specification languages that can be used to formally describe the instruction set, and process 100 is not limited by the formal specification language used. A description of the ISA for a processor typically describes what instructions are available; what addressing modes are available; what is the format of data; what is the format of data; how many and what kind of registers are available; what condition codes, if any, are defined; and how are exceptions and interrupts handled. Examples of different instruction set architectures (ISAs) include CISC (Complex Instruction Set Computer), RISC (Reduced Instruction Set Computer), ARM (Advanced RISC Machine), and MIPS (Microprocessor without Interlocked Pipeline Stages), to name a few. Preferably the formal specification can be processed into a formal analysis construct like a binary decision diagram (BDD). Boolean functions can typically be represented as a binary-decision diagram (BDD), and usually BDD refers to a reduced-order binary decision diagram (ROBDD). See Randal E. Bryant, "Graph-Based Algorithms for Boolean Function Manipulation", *IEEE Transactions on Computers*, C-35(8):677-691, 1986.

At 120 interesting outcomes, also referred to as interesting cases, are defined. What constitutes an interesting outcome/case can be at the discretion of a user. In one or more embodiments, a user defines interesting cases or outcomes. In an example, an interesting outcome implies cases where the output of the instruction diverges significantly from nearby cases. An interesting outcome can be an output or result of the instruction that is not expected, deviates from typical outcomes, and/or deviates from nearby cases. To illustrate an example of an interesting case where the result of the instruction diverges significantly from nearby cases or deviates from typical outcomes is integer division by zero which produces an exception/interrupt, whereas integer division by the nearby numbers +1 or −1 produces an integer result. Interesting cases can be defined by formal language in the instruction set architecture (ISA).

The process 100 then continues to 130 where it is determined if there are any (more) instructions to the instruction set architecture (ISA). If there are instructions (130: Yes), then process 100 continues to 140 where the next instruction is obtained, and alternatively if there are no instructions (130: No), then process 100 continues to 135 and the process 100 ends. If an instruction is obtained at 140, then process 100 proceeds to 150 where it is determined if there are any interesting cases for the instruction. If at 150 it is determined that there are no interesting cases/outcomes for that instruction (150: No), then process 100 proceeds to 130 where it is determined whether there are more instructions to the instruction set architecture (ISA). If at 150 it is determined there are one or more interesting cases (150: Yes), then process 100 continues to 160 (FIG. 1B).

At 160 the size of the input space ($I_O$) is computed. The arguments and state information for an operation composes the input space. The formal specification of the instruction implies a total space for the input. The input space typically will be 2 to the power of the number of bits input to the process. For example, if the natural word size for the processor is 32 bits or 64 bits, the size of the input space would be $2^{32}$ or $2^{64}$, respectively. Process 100 continues to 170, where the space leading to an interesting outcome/case is measured using a Boolean satisfiability solver, also referred to as a SAT solver, program to determine if a given desired output can be reached with any available inputs. Preferably a variant of the SAT solver, the sharp-SAT solver, which returns a count of the number of solutions that exist for a given output, is used. A discussion of a sharp-SAT solver is discussed in Valiant, L.G., "The complexity of computing the permanent", *Theoretical Computer Science*, 8(2):189-201 (1079), the entirety of which is incorporated by reference herein. That is at 170, each interesting outcome (e.g., case) defined at 120 is expressed as a formal condition that a satisfiability solver can process. The formal condition is fed into the SAT solver, preferably the sharp SAT solver, to find all the conditions in the input space that satisfy the formal condition. The number of the cases found and/or computed indicates the number of input conditions that cause an interesting case outcome. The number of cases found by the SAT solver is referred to as the interesting case space and is represented as ($I_i$).

At 180 the interesting case space ($I_i$) (determined at 170) is divided by the total input space size ($I_O$) (computed at 160) resulting in a fraction of the possible input space that causes the interesting outcome. At 190 it is determined whether the fraction ($I_i$)/($I_O$) is less than a threshold. The threshold is typically set by the user and can be fixed, predetermined, preset, adjustable, and/or programmable. The threshold is usually small (e.g., less than 1 in $2^{32}$ ($1:2^{32}$), for a thirty-two word bit processor).

If at 190 the fraction is less than the threshold (190: Yes), indicating that the interesting outcome for that instruction is special, then process 100 continue to 195 where the result can be documented, for example, for use in generating test cases. For example, the discovery of a special case/outcome at 190 can be used at 195 to drive the behavior of random test generators to make the special cases more common than they would normally occur. The exact mechanism for controlling the behavior of the random test generator is beyond the scope of this disclosure and would depend on the random test generator used. The discovery of special cases (190: Yes), can also be converted to cover points at 195 to encourage and/or ensure that these cases are exercised in the verification environment.

After 195 where the special case is documented, and/or if at 190 the fraction is not smaller than the fraction (190: No), indicating that the case (the interesting outcome) is not special, then process 100 continues to 150 where it is determined whether there are anymore interesting cases for the instruction at issue. If there are more interesting cases for the instruction at issue at 150 (150: Yes), then process 100 continues for the next interesting case for that instruction to perform steps 160-190. That is, in a preferred embodiment, the steps 160-195 are performed on a per interesting case per instruction basis, so after an interesting case for an instruction is determined, process 100 goes back to 150 where it is determined whether there are any more interesting cases for that instruction. If there are no more interesting cases for that instruction at 150 (150: No), then process 100 continues to 130 where it is determined whether there are any more instructions to the ISA. Process 100 in this manner can be repeated for every instruction in the instruction set architecture (ISA). Runtime is not a primary concern as the process 100 should only have to be run once, and preferably is only repeated if some instructions change in the future.

In interesting cases that are special, it would be advantageous to have those special interesting cases happen more frequently than they might otherwise if they were generated as a result of a random test generator. For example, having discovered, determined, and/or identified a special case (an interesting case that is special), then the test generator might alter the random generation process so that the special case happens, for example, 10% of the time and in 90% of the cases the cases are randomly generated.

It will be understood that one or more blocks of the flowchart illustrations in FIGS. 1A-1B, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions, and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

Figure 2:
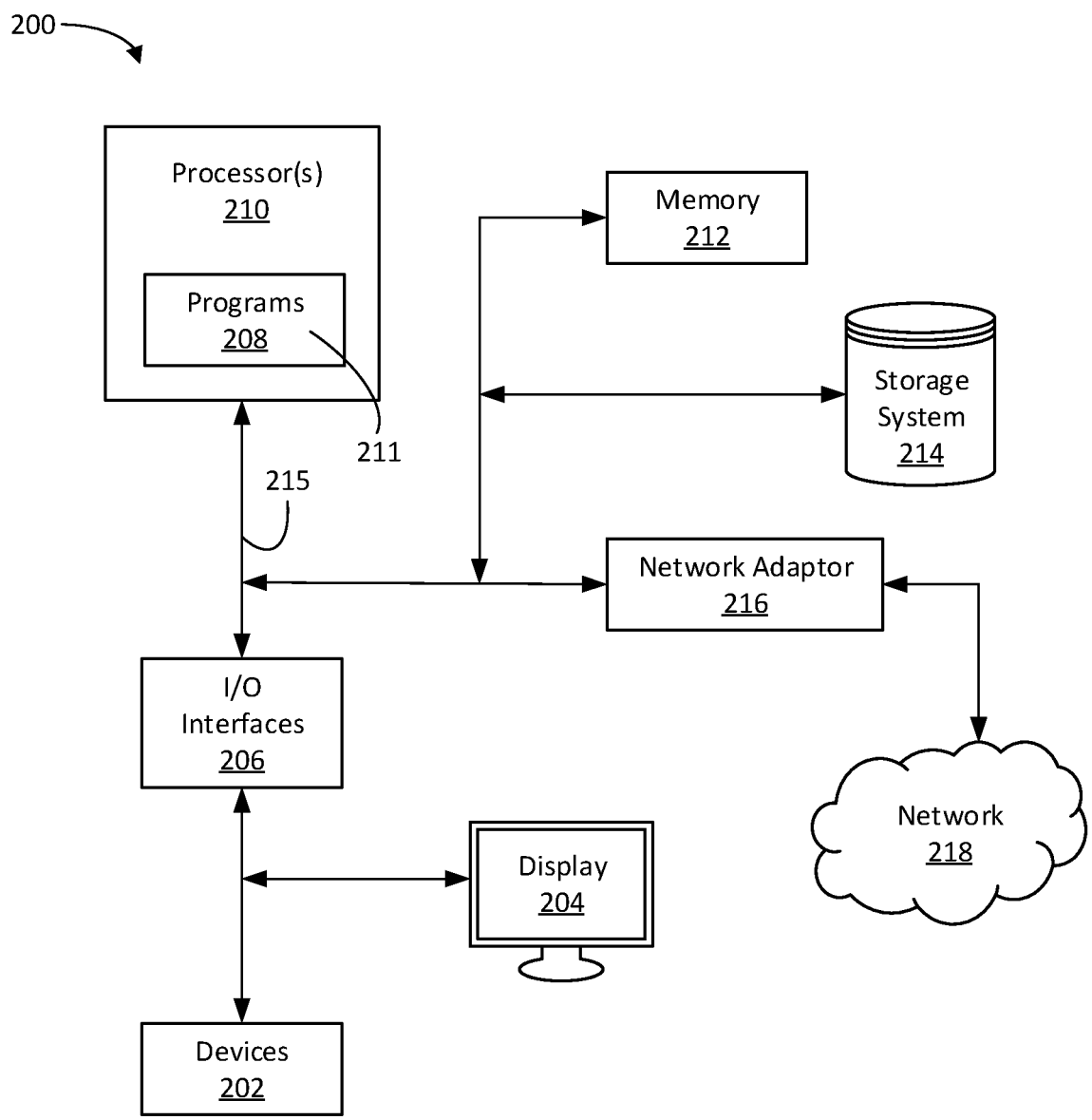
FIG. 2 schematically shows a block diagram of an exemplary computer system on which the present disclosure may be practiced according to an embodiment.

FIG. 2 illustrates an example computing and/or data processing system 200 in which aspects of the present disclosure may be practiced. It is to be understood that the computer and/or data processing system 200 depicted is only one example of a suitable processing system and is not intended to suggest any limitation as to the scope of use or functionality of embodiments of the present invention. For example, the system shown may be operational with numerous other special-purpose computing system environments or configurations. Examples of well-known computing systems, environments, and/or configurations that may be suitable for use with the system shown in FIG. 2 may include, but are not limited to, server computer systems, mainframe computers, distributed cloud computer systems, personal computer (PC) systems, PC networks, thin clients, thick clients, minicomputer systems, handheld or laptop devices, multiprocessor systems, microprocessor-based systems, smart phone, set top boxes, programmable consumer electronics, and the like that include any of the above systems or devices, and the like.

In some embodiments, the computer system 200 may be described in the general context of computer system executable instructions, embodied as program modules stored in memory 212, being executed by the computer system. Generally, program modules may include routines, programs, objects, components, logic, data structures, and so on that perform particular tasks and/or implement particular input data and/or data types in accordance with the present invention.

The components of the computer system 200 may include, but are not limited to, one or more processors or processing units 210, a memory 212, and a bus 215 that operably couples various system components, including memory 212 to processor 210. In some embodiments, the processor 210, which is also referred to as a central processing unit (CPU) or microprocessor, may execute one or more programs or modules 208, or portions of programs or modules 208, that are loaded from memory 212 to local memory 211, where the program module(s) embody software (program instructions) that cause the processor to perform one or more operations. In some embodiments, module 208 may be programmed into the integrated circuits of the processor 210, loaded from memory 212, storage device 214, network 218 and/or combinations thereof to local memory 211.

The processor (or CPU) 210 can include various functional units, registers, buffers, execution units, caches, memories, and other units formed by integrated circuitry, and may operate according to reduced instruction set computing ("RISC") techniques. The processor 210 processes data according to processor cycles, synchronized, in some aspects, to an internal clock (not shown). Bus 215 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture bus, Micro Channel Architecture (MCA) bus, Enhanced ISA (EISA) bus, Video Electronics Standards Association (VESA) local bus, and Peripheral Component Interconnects (PCI) bus. The computer system 200 may include a variety of computer system readable media, including non-transitory readable media. Such media may be any available media that is accessible by the computer system 200, and it may include both volatile and non-volatile media, removable and non-removable media.

Memory 212 (sometimes referred to as system or main memory) can include computer readable media in the form of volatile memory, such as random-access memory (RAM), cache memory and/or other forms. Computer system may further include other removable/non-removable, volatile/non-volatile computer system storage media. By way of example only, storage system 214 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 215 by one or more data media interfaces.

The computer system may also communicate with one or more external devices 202 such as, for example, a keyboard, track ball, mouse, microphone, speaker, a pointing device, a display 204, etc.; one or more devices that enable a user to interact with the computer system, such as for example, a keyboard, track ball, mouse, pointing device, speaker, etc.; and/or any devices (e.g., network card, modem, etc.) that enable the computer system to communicate with one or more other computing devices. Such communication can occur via Input/Output (I/O) interfaces 206.

Communications or network adapter 216 interconnects bus 215 with an outside network 218 enabling the data processing system 200 to communicate with other such systems. Additionally, an operating system such as, for example, AIX ("AIX" is a trademark of the IBM Corporation) is used to coordinate the functions of the various components shown in FIG. 2.

The computer system 200 can communicate with one or more networks 218 such as a local area network (LAN), a general wide area network (WAN), and/or a public network (e.g., the Internet) via network adapter 216. As depicted, network adapter 218 communicates with the other components of computer system via bus 215. It should be understood that although not shown, other hardware and/or software components could be used in conjunction with the computer system. Examples include, but are not limited to: microcode, device drivers, redundant processing units, external disk-drive arrays, RAID systems, tape drives, and data archival storage systems, etc.

One or more embodiments of the present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

The corresponding structures, materials, acts, and equivalents of all means or step plus function elements in the claims below are intended to include any structure, material, or act for performing the function in combination with other claimed elements as specifically claimed. The description of the embodiments of the present disclosure has been presented for purposes of illustration and description, but is not intended to be exhaustive or limited to the embodiments in the form disclosed. Many modifications and variations will be apparent to those of ordinary skill in the art without departing from the scope and spirit of the disclosure. The embodiments and examples were chosen and described in order to best explain the principles of the disclosure and the practical application, and to enable others of ordinary skill in the art to understand the disclosure for various embodiments with various modifications as are suited to the particular use contemplated.

The programs described herein are identified based upon the application for which they are implemented in a specific embodiment of the disclosure. However, it should be appreciated that any particular program nomenclature herein is used merely for convenience, and thus the disclosure should not be limited to use solely in any specific application identified and/or implied by such nomenclature.

It will be clear that the various features of the foregoing systems and/or methodologies may be combined in any way, creating a plurality of combinations from the descriptions presented above.

It will be further appreciated that embodiments of the present disclosure may be provided in the form of a service deployed on behalf of a customer to offer service on demand.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for performing functional performance testing of an integrated circuit having multiprocessing capabilities, the method comprising:

defining interesting cases, wherein the interesting cases are results of instructions that when executed by the integrated circuit deviate from expected outcomes;

obtaining an instruction from an instruction set architecture (ISA) for the integrated circuit;

determining a first interesting case that should result in response to executing the obtained instruction by the integrated circuit;

in response to determining the first interesting case that should result in response to executing the obtained instruction by the integrated circuit, (i) computing a size of an input space ($I_O$) of the instruction set architecture, and (ii) computing a first interesting case space ($I_{1i}$) which is the input space leading to the first interesting case for the obtained instruction;

obtaining a first special case fraction by dividing the first interesting case space ($I_{1i}$) by the input space ($I_O$);

determining the first special case fraction $(I_{1i})/(I_0)$ is less than a threshold;

identifying, in response to the first special case fraction being less than the threshold, the interesting case as a first special case; and increasing, in response to identifying the first special case, a probability of generating the first special case in response to executing the obtained instruction during functional performance testing of the integrated circuit.

2. The method of claim 1, further comprising documenting the first special case in response to identifying the interesting case as the first special case.

3. The method of claim 1, wherein the integrated circuit is a processor, and the method further comprising formally describing the instruction set architecture (ISA) for the processor.

4. The method of claim 1, further comprising defining the interesting cases by a user, wherein interesting cases imply cases where an output of the instruction diverges from nearby cases.

5. The method of claim 1, wherein the first interesting case includes at least one of a group consisting of: division by zero; division which results in the smallest possible normal number; division which results in the largest possible subnormal number; division which results in the smallest possible subnormal number; division which results in the largest possible underflow case; and combinations thereof.

6. The method of claim 1, wherein the first interesting case space $(I_{1i})$ is computed using a Boolean Satisfiability Solver (SAT Solver).

7. The method of claim 6, wherein the SAT Solver is a sharp-SAT Solver.

8. The method of claim 1, wherein the threshold is at least one of a group consisting of: fixed, predetermined, preset, adjustable, programmable, and combinations thereof.

9. The method of claim 1, wherein the threshold is set by a user and is less than $1:2^{32}$.

10. The method of claim 1, further comprising:

determining the first special case fraction $(I_{1i})/(I_0)$ is equal to or greater than the threshold; and determining, in response to determining that the first special case fraction is equal to or greater than the threshold, if a second interesting case should result in response to executing the obtained instruction by the integrated circuit.

11. The method of claim 1, wherein after identifying the interesting case as the first special case the method comprises:

determining if a second interesting case should result in response to executing the obtained instruction by the integrated circuit.

12. The method of claim 11, further comprising:

computing, in response to determining the second interesting case should result in response to executing the obtained instruction by the integrated circuit, a second interesting case space $(I_{2i})$ which is an input space leading to the second interesting case for the obtained instruction;

obtaining a second special case fraction by dividing the second interesting case space $(I_{2i})$ by the input space $(I_0)$;

determining the second special case fraction $(I_{2i})/(I_0)$ is less than the threshold;

identifying, in response to the second special case fraction being less than the threshold, the second interesting case as a second special case; and adjusting, in response to identifying the second special case, a random test generator to increase a probability of generating the second special case in response to executing the obtained instruction by the integrated circuit.

13. The method of claim 1, further comprising performing, for each instruction in the instruction set architecture (ISA), the steps of the method of claim 1.

14. The method of claim 1, further comprising adjusting, in response to identifying the first special case, a random test generator to increases the probability of generating the first special case and using the random test generator to test the integrated circuit.

15. A system for testing functional performance of a processor having multiprocessing capabilities, the system comprising one or more processors having circuitry and logic configured to:

provide an instruction set architecture (ISA) for the processor to be tested;

receive an input defining interesting cases, wherein the interesting cases are results of instructions in the ISA that when executed by the processor deviate from expected outcomes;

obtain an instruction from the instruction set architecture (ISA) for the processor;

determine that there is a first interesting case that should result in response to executing the obtained instruction by the processor;

in response to determining the first interesting case that should result in response to executing the obtained instruction by the processor, (i) compute a size of an input space $(I_0)$ of the instruction set architecture, and (ii) compute a first interesting case space $(I_{1i})$ which is the input space leading to the first interesting case for the obtained instruction;

obtain a first special case fraction by dividing the first interesting case space $(I_{1i})$ by the input space $(I_0)$;

determine the first special case fraction $(I_{1i})/(I_0)$ is less than a threshold;

identify, in response to the first special case fraction being less than the threshold, the interesting case as a first special case; and adjust, in response to identifying the first special case, a random test generator to increase a probability of generating the first special case in response to executing the obtained instruction by the processor.

16. The system of claim 15, wherein the first interesting case space (Iii) is computed using a Boolean Satisfiability Solver (SAT Solver).

17. The system of claim 15, wherein the system receives input from a user defining the interesting cases, and the interesting cases include at least one of a group consisting of:

division by zero;

division which results in the smallest possible normal number;

division which results in the largest possible subnormal number;

division which results in the smallest possible subnormal number;

division which results in the largest possible underflow case; and combinations thereof.

18. The system of claim 15, further configured to:

determine the first special case fraction $(I_{1i})/(I_0)$ is equal to or greater than the threshold; and determine, in response to determining that the first special case fraction is equal to or greater than the threshold, if a second interesting case should result in response to execution of the obtained instruction by the processor.

19. The system of claim 15, further configured to:
determine, after identifying the interesting case as the first special case, if a second interesting case should result in response to execution of the obtained instruction by the processor.

20. The system of claim 19, further configured to:
compute, in response to determining the second interesting case exists for the obtained instruction, a second interesting case space ($I_{21}$) which is an input space leading to the second interesting case for the obtained instruction;

obtain a second special case fraction by dividing the second interesting case space ($I_{21}$) by the input space ($I_O$);

determine the second special case fraction ($I_{2i}$)/($I_O$) is less than the threshold;

identify, in response to the second special case fraction being less than the threshold, the second interesting case as a second special case; and adjust, in response to identifying the second special case, the random test generator to increase a probability of generating the second special case in response to executing the obtained instruction by the processor.

\* \* \* \* \*